United States Patent
Oh

(10) Patent No.: US 10,303,014 B2
(45) Date of Patent: May 28, 2019

(54) DISPLAY APPARATUS AND METHOD OF MANUFACTURING THE SAME

(71) Applicant: SAMSUNG DISPLAY CO., LTD., Yongin-si, Gyeonggi-do (KR)

(72) Inventor: Myong-soo Oh, Asan-si (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 7 days.

(21) Appl. No.: 15/611,859

(22) Filed: Jun. 2, 2017

(65) Prior Publication Data

US 2017/0357122 A1 Dec. 14, 2017

(30) Foreign Application Priority Data

Jun. 8, 2016 (KR) .................. 10-2016-0071258

(51) Int. Cl.
```
H05K 1/02      (2006.01)
H05K 1/11      (2006.01)
G02F 1/1333    (2006.01)
G02F 1/1341    (2006.01)
G02F 1/1345    (2006.01)
G02F 1/1362    (2006.01)
H05K 3/36      (2006.01)
H01L 27/32     (2006.01)
```
(52) U.S. Cl.
CPC ........ *G02F 1/13452* (2013.01); *G02F 1/1341* (2013.01); *G02F 1/136286* (2013.01); *H01L 27/3276* (2013.01); *H05K 1/0269* (2013.01); *H05K 1/111* (2013.01); *H05K 3/361* (2013.01); *G02F 1/13458* (2013.01); *G02F 2001/133354* (2013.01); *H05K 2201/10128* (2013.01); *H05K 2201/10136* (2013.01); *H05K 2203/166* (2013.01)

(58) Field of Classification Search
CPC ..... G02F 1/13452; G02F 2001/133354; G02F 1/13458; G02F 1/136286; H05K 1/111; H05K 1/0269; H05K 2201/10128; H05K 2203/166; H05K 2201/10136
See application file for complete search history.

(56) References Cited

FOREIGN PATENT DOCUMENTS

| JP | 2000114677 A | * 4/2000 |
|----|---|---|
| JP | 2007-133288 A | 5/2007 |
| KR | 10-1999-0012596 A | 2/1999 |
| KR | 10-2009-0057720 A | 6/2009 |

(Continued)

*Primary Examiner* — Jessica M Merlin
(74) *Attorney, Agent, or Firm* — Lee & Morse, P.C.

(57) ABSTRACT

A display apparatus may include a display panel and a plurality of flexible printed circuit boards connected to the display panel. The display panel may include first regions arranged in a first direction and may include a plurality of first alignment marks, which are respectively provided on the first regions and are arranged in the first direction. Each of the flexible printed circuit boards may include a plurality of second alignment marks arranged in the first direction and overlapped with the first alignment marks, an insulating layer spaced apart from the second alignment marks in a second direction crossing the first direction, and a plurality of supplementary alignment marks spaced apart from the second alignment marks by a first distance in the second direction, the supplementary alignment marks being openings defined in the insulating layer.

20 Claims, 10 Drawing Sheets

(56) References Cited

FOREIGN PATENT DOCUMENTS

| KR | 10-2012-0077440 A | 7/2012 |
|----|-------------------|--------|
| KR | 10-2013-0089509 A | 8/2013 |
| KR | 10-1422746 B1     | 7/2014 |

\* cited by examiner

DISPLAY APPARATUS AND METHOD OF MANUFACTURING THE SAME

CROSS-REFERENCE TO RELATED APPLICATIONS

Korean Patent Application No. 10-2016-0071258, filed on Jun. 8, 2016, in the Korean Intellectual Property Office, and entitled: "Display Apparatus And Method Of Manufacturing The Same," is incorporated by reference herein in its entirety.

BACKGROUND

1. Field

Embodiments relate to a display apparatus and a method of manufacturing the same.

2. Description of the Related Art

In general, a display apparatus includes a plurality of pixels, a gate driving part configured to provide gate signals to the pixels, and a data driving part configured to provide data voltages to the pixels. The pixels are configured to provide data voltages in response to the gate signals and to display images with gradation levels corresponding to the data voltages.

SUMMARY

Embodiments are directed to a display apparatus, including a display panel and a plurality of flexible printed circuit boards connected to the display panel. The display panel may include first regions arranged in a first direction and a plurality of first alignment marks, which are respectively provided on the first regions and are arranged in the first direction. Each of the flexible printed circuit boards may include a plurality of second alignment marks arranged in the first direction and overlapped with the first alignment marks, an insulating layer spaced apart from the second alignment marks in a second direction crossing the first direction, and a plurality of supplementary alignment marks spaced apart from the second alignment marks by a first distance in the second direction, the supplementary alignment marks being openings defined in the insulating layer.

In some embodiments, the display panel may include first and second substrates facing each other and a liquid crystal layer between the first and second substrates. The first regions may be defined in the first substrate, the first alignment marks may be provided on the first regions of the first substrate, and the first regions may be disposed to be adjacent to a side of the first substrate in the second direction.

In some embodiments, the first substrate may further include a plurality of pixels connected to a plurality of gate lines and a plurality of data lines, and a plurality of first pads arranged in the first direction and provided on the first regions, respectively. The data lines may be connected to the first pads, and the first alignment marks may be spaced apart from each other with the first pads interposed therebetween.

In some embodiments, each of the flexible printed circuit boards may further include a second region, which is adjacent to a side thereof in the second direction, and a plurality of second pads, which are provided on the second region. The second region of each of the flexible printed circuit boards may be overlapped with a corresponding one of the first regions, and the insulating layer of each of the flexible printed circuit boards may be provided on a third region of each of the flexible printed circuit boards, which is adjacent to the second region of each of the flexible printed circuit boards. The first alignment marks of each of the flexible printed circuit boards may be spaced apart from each other in the first direction with the second pads of each of the flexible printed boards interposed therebetween.

In some embodiments, the display apparatus may further include a plurality of anisotropic conductive films provided between the first regions of the first substrate and the second regions of the flexible printed circuit boards.

In some embodiments, the first pads on the first regions and the second pads on the second regions may be electrically connected to each other through the anisotropic conductive films.

In some embodiments, the insulating layer of each of the flexible printed circuit boards may be thicker than each of the anisotropic conductive films.

In some embodiments, the first and second alignment marks and the supplementary alignment marks may have the same shape.

In some embodiments, each of the first and second alignment marks and the supplementary alignment marks may include a first extended portion extending in the first direction and a plurality of second extended portions extending from both end portions of the first extended portion in the second direction.

Embodiments are also directed to a method of manufacturing a display apparatus, the method including preparing a first substrate, in which first regions arranged in a first direction are defined, the first substrate including first alignment marks provided on the first regions, respectively, preparing a plurality of flexible printed circuit boards, each of which includes a plurality of second alignment marks arranged in the first direction, an insulating layer spaced apart from the second alignment marks in a second direction crossing the first direction, and a plurality of supplementary alignment marks spaced apart from the second alignment marks by a first distance in the second direction, the supplementary alignment marks being formed by etching the insulating layer, overlapping the supplementary alignment marks to the first alignment marks, moving the flexible printed circuit boards by the first distance in the second direction to overlap the second alignment marks to the first alignment marks, attaching the flexible printed circuit boards to the first regions of the first substrate, and disposing a second substrate to face the first substrate and disposing a liquid crystal layer between the first and second substrates.

BRIEF DESCRIPTION OF THE DRAWINGS

Features will become apparent to those of skill in the art by describing in detail example embodiments with reference to the attached drawings in which.

DETAILED DESCRIPTION

Figure 1:
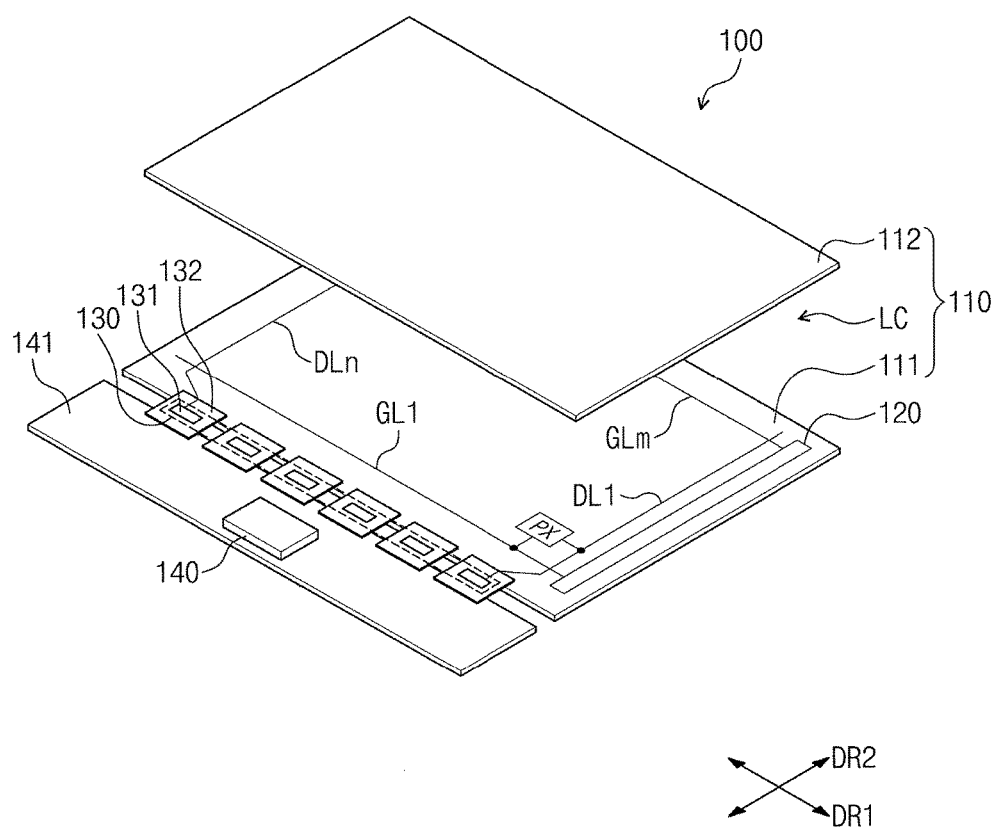
FIG. 1 illustrates a perspective view of a display apparatus according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

FIG. 1 is a perspective view illustrating a display apparatus according to an example embodiment.

Referring to FIG. 1, a display apparatus 100 according to an example embodiment may include a display panel 110, a gate driving part 120, a data driving part 130, a plurality of flexible printed circuit boards 132, a timing controller 140, and a driving circuit board 141.

The display panel 110 may have a long side, which extends in a first direction DR1, and a short side, which extends in a second direction DR2 crossing the first direction DR1. The gate driving part 120 may be provided on a region of the display panel 110, which is positioned adjacent to a side of the display panel 110 in the first direction DR1, and the data driving part 130 may be connected to a side of the display panel 110 in the second direction DR2.

In some embodiments, the display panel 110 may be a liquid crystal display panel with a liquid crystal layer LC, but, for example, the display panel 110 may be an organic light emitting display panel, an electrowetting display panel, or an electrophoresis display panel.

The display panel 110 may include a first substrate 111, a second substrate 112 facing the first substrate 111, and the liquid crystal layer LC between the first and second substrates 111 and 112. A plurality of pixels PX, a plurality of gate lines GL1-GLm, and a plurality of data lines DL1-DLn may be provided on the first substrate 111, where m and n are integers greater than 0. Although, for convenience in description, one pixel PX is illustrated in FIG. 1, a plurality of the pixels PX may be provided on the first substrate 111.

The gate lines GL1-GLm and the data lines DL1-DLn may be electrically disconnected from each other and may be provided to cross each other. The gate lines GL1-GLm may extend in the first direction DR1 and may be connected to the gate driving part 120. The data lines DL1-DLn may extend in the second direction DR2 and may be connected to the data driving part 130.

The pixels PX may be respectively provided in regions, which are defined by the gate lines GL1-GLm and the data lines DL1-DLn, thereby forming a matrix shaped arrangement. The pixels PX may be connected to the gate lines GL1-GLm and the data lines DL1-DLn. Each of the pixels PX may be configured to display, for example, primary colors such as red, green, or blue, or for example, white, or, for example, various colors, such as yellow, cyan, and magenta, etc.

The gate driving part 120 may be provided on a region of the first substrate 111, which is adjacent to a side of the first substrate 111 in the first direction DR1. The gate driving part 120 may be formed at the same time using the same process as that for the transistors of the pixels PX. For example, the gate driving part 120 may be an amorphous silicon TFT gate (ASG) driver circuit or an oxide silicon TFT gate (OSG) driver circuit that is provided on the first substrate 111.

In another implementation, for example, the gate driving part 120 may include a plurality of driver chips that are mounted on flexible printed circuit boards and are connected to the first substrate 111 through the flexible printed circuit boards. Thus, the gate driving part 120 may be connected to the first substrate 111 in a tape carrier package (TCP) manner. In an embodiment, the gate driving part 120 may include a plurality of driver chips mounted on the first substrate 111 in a chip-on-glass (COG) manner.

The data driving part 130 may include a plurality of source driver chips 131. The source driver chips 131 may be mounted on the flexible printed circuit boards 132 and may be connected to a region of the first substrate 111, which is adjacent to a side of the first substrate 111 in the second direction DR2, and the driving circuit board 141. Thus, the data driving part 130 may be connected to the first substrate 111 in a tape carrier package (TCP) manner.

The flexible printed circuit boards 132 may be connected to a side of the display panel 110. For example, the flexible printed circuit boards 132 may be aligned to the first substrate 111 of the display panel 110 using first alignment marks of the display panel 110 and second alignment marks and supplementary alignment marks of the flexible printed circuit boards 132 and may be connected to a side edge of the first substrate 111. A method of aligning the flexible printed circuit boards 132 to the first substrate 111 will be described in more detail below.

The timing controller 140 may be provided in the form of an integrated circuit chip and may be mounted on the driving circuit board 141. The timing controller 140 may be connected to the gate and data driving parts 120 and 130 via the driving circuit board 141 and the flexible printed circuit boards 132, which are connected to each other. The driving circuit board 141 may be a printed circuit board (PCB). The timing controller 140 may be configured to output gate control signals, data control signals, and image data.

The gate driving part 120 may be configured to receive gate control signals provided from the timing controller 140. The gate driving part 120 may also be configured to generate and sequentially output gate signals in response to the gate control signals. The gate signals may be provided to the pixels PX through the gate lines GL1-GLm. The pixels PX may be operated row by row in response to the gate signals.

The data driving part 130 may be configured to receive image data and data control signals from the timing controller 140. The data driving part 130 may be configured to generate and output analog data voltages corresponding to the image data in response to the data control signal. The data voltages may be provided to the pixels PX through the data lines DL1-DLn.

The pixels PX may be configured to receive the data voltages through the data lines DL1-DLn, in response to the gate signals provided through the gate lines GL1-GLm. The pixels PX may be configured to display images with gradation levels corresponding to the data voltages. The gate signals and the data voltages may be changed to control light transmittance of the pixels PX, and thereby to display a desired image on the display panel 110. Although not shown, the display apparatus 100 may further include a backlight unit which is provided at a rear side of the display panel 110 and provides light to the display panel 110.

Figure 2:
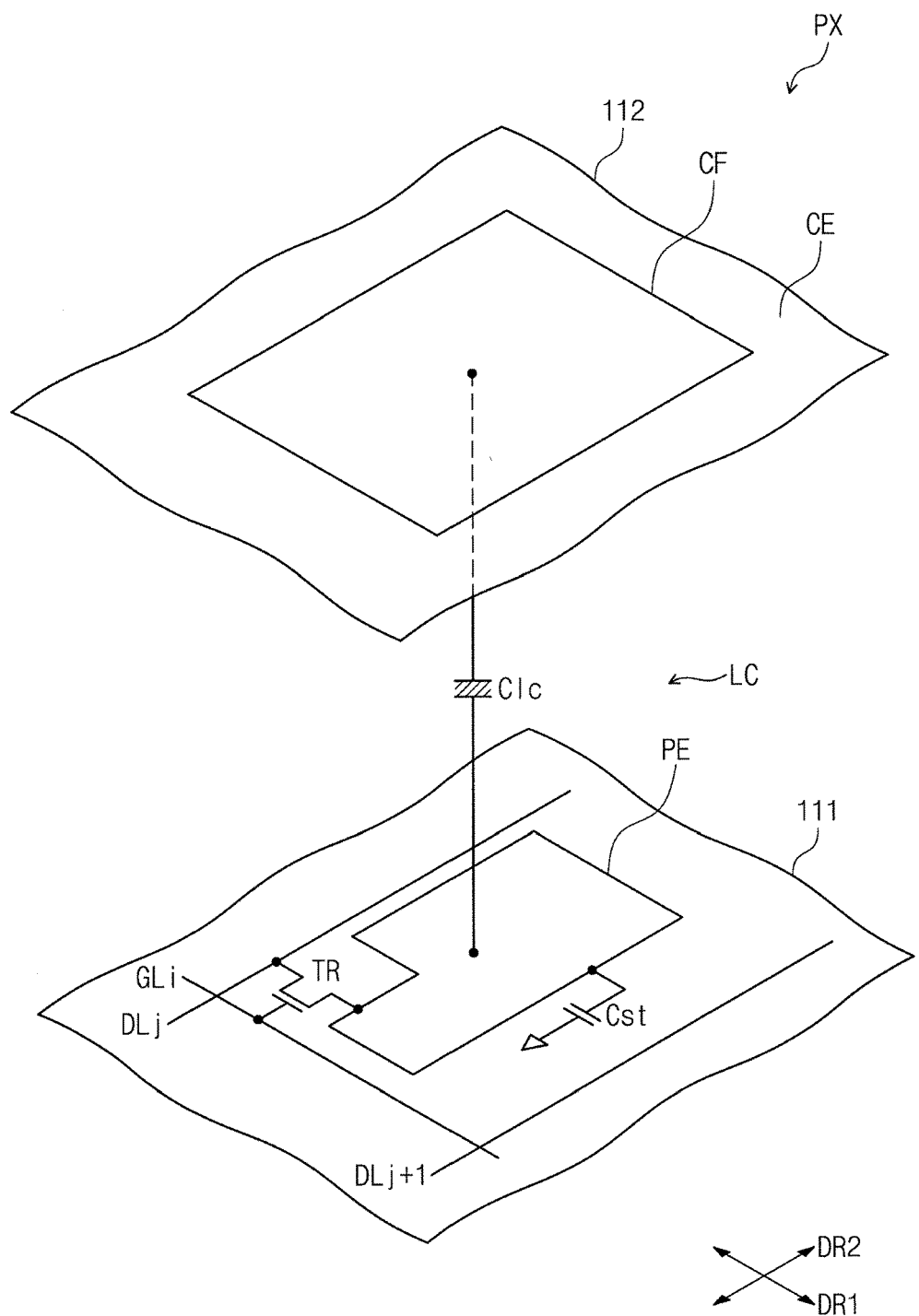
FIG. 2 illustrates a diagram of a structure of each of pixels shown in FIG. 1.

FIG. 2 is a diagram illustrating a structure of each of pixels shown in FIG. 1.

For convenience in description, FIG. 2 illustrates a pixel PX connected to a gate line GLi and a data line DLj. Although not shown, other pixels of the display panel 110 may be configured to have substantially the same features as that of the pixel PX shown in FIG. 2.

Referring to FIG. 2, the pixel PX may include a transistor TR connected to the gate line GLi and the data line DLj, a liquid crystal capacitor Clc connected to the transistor TR, and a storage capacitor Cst connected in parallel to the liquid crystal capacitor Clc, where i and j are integers.

The transistor TR may be provided on the first substrate 111. The transistor TR may include a gate electrode connected to the gate line GLi, a source electrode connected to the data line DLj, and a drain electrode connected to the liquid crystal capacitor Clc and the storage capacitor Cst.

The liquid crystal capacitor Clc may include a pixel electrode PE disposed on the first substrate 111, a common electrode CE disposed on the second substrate 112, and the liquid crystal layer LC disposed between the pixel electrode PE and the common electrode CE. The liquid crystal layer LC may be used as a dielectric material. The pixel electrode PE may be connected to the drain electrode of the transistor TR.

In another implementation, the pixel electrode PE may be provided to have a slit structure including a cross-shaped stem portion and a plurality of branches extending radially from the stem portion.

The common electrode CE may be disposed entirely on the second substrate 112. In another implementation, for example, the common electrode CE may be provided on the first substrate 111. In this case, at least one of the pixel electrode PE and the common electrode CE may be configured to include a slit.

The storage capacitor Cst may include the pixel electrode PE, a storage electrode diverging from a storage line, and an insulating layer disposed between the pixel electrode PE and the storage electrode. The storage line may be provided on the first substrate 111, and the storage line and the gate lines GL1-GLm may be simultaneously formed by the same process. The storage electrode may be partially overlapped with the pixel electrode PE.

The pixel PX may further include a color filter CF, which is configured to display one of red, green, and blue colors. In some embodiments, the color filter CF may be provided on the second substrate 112, as shown in FIG. 2. In another implementation, for example, the color filter CF may be provided on the first substrate 111.

The transistor TR may be turned on in response to a gate signal applied to the gate line GLi. If a data voltage is received via the data line DLj, the data voltage may be applied to the pixel electrode PE of the liquid crystal capacitor Clc via the transistor TR. A common voltage may be applied to the common electrode CE.

Due to a difference in voltage level between the data voltage and the common voltage, an electric field may be produced between the pixel electrode PE and the common electrode CE. The electric field between the pixel electrode PE and the common electrode CE may be used to change the motion or orientation of liquid crystal molecules of the liquid crystal layer LC. The change in motion or orientation of the liquid crystal molecules may be controlled to adjust light transmittance of the liquid crystal layer LC and thereby to display an image.

A storage voltage of a constant level may be applied to the storage line. In another implementation, for example, the common voltage may be applied to the storage line. The storage capacitor Cst may be configured to complement the voltage charged in the liquid crystal capacitor Clc.

Figure 3:
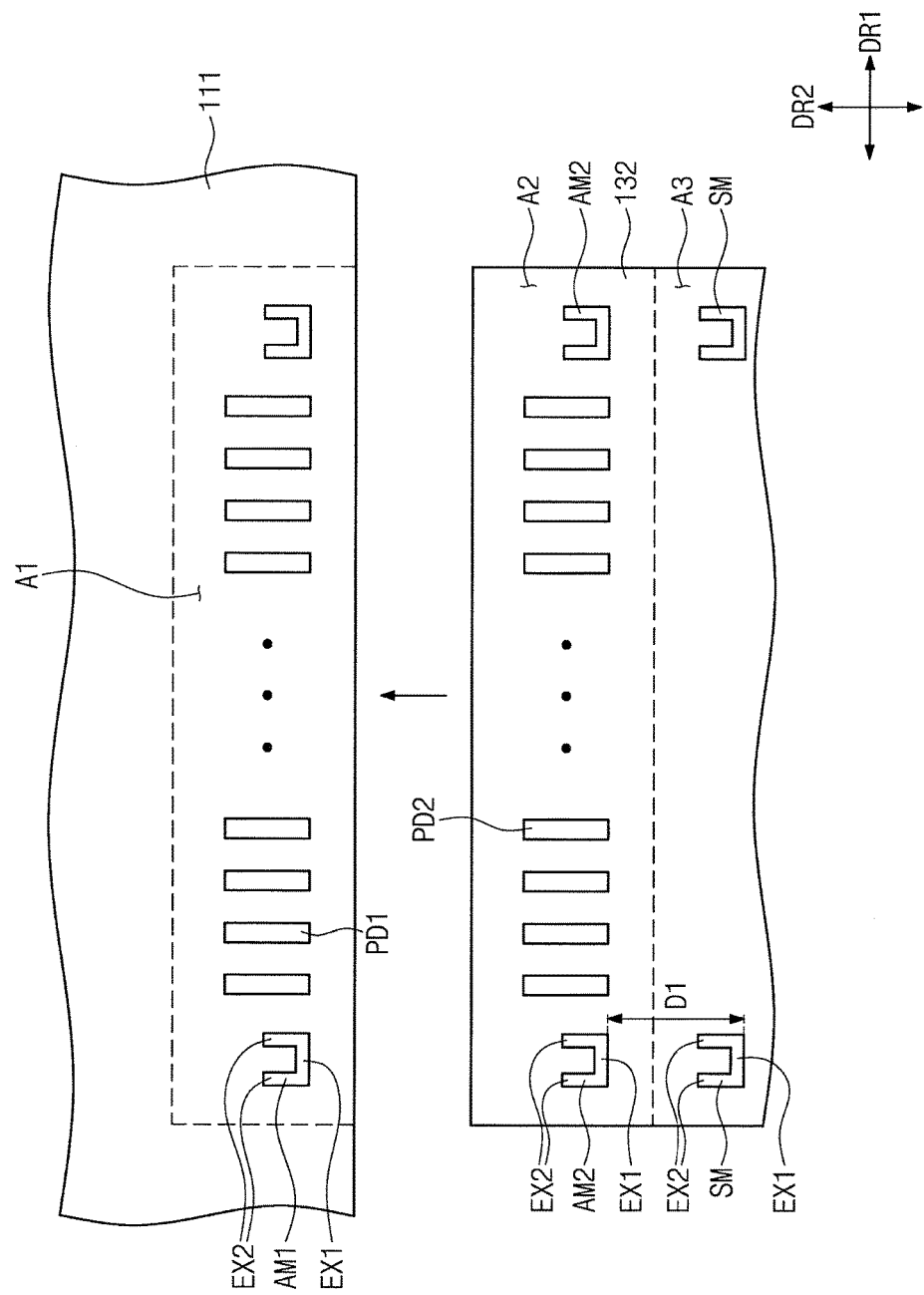
FIG. 3 illustrates a diagram of a state in which a first substrate is separated from one of the flexible printed circuit boards of FIG. 1.
Figure 4:
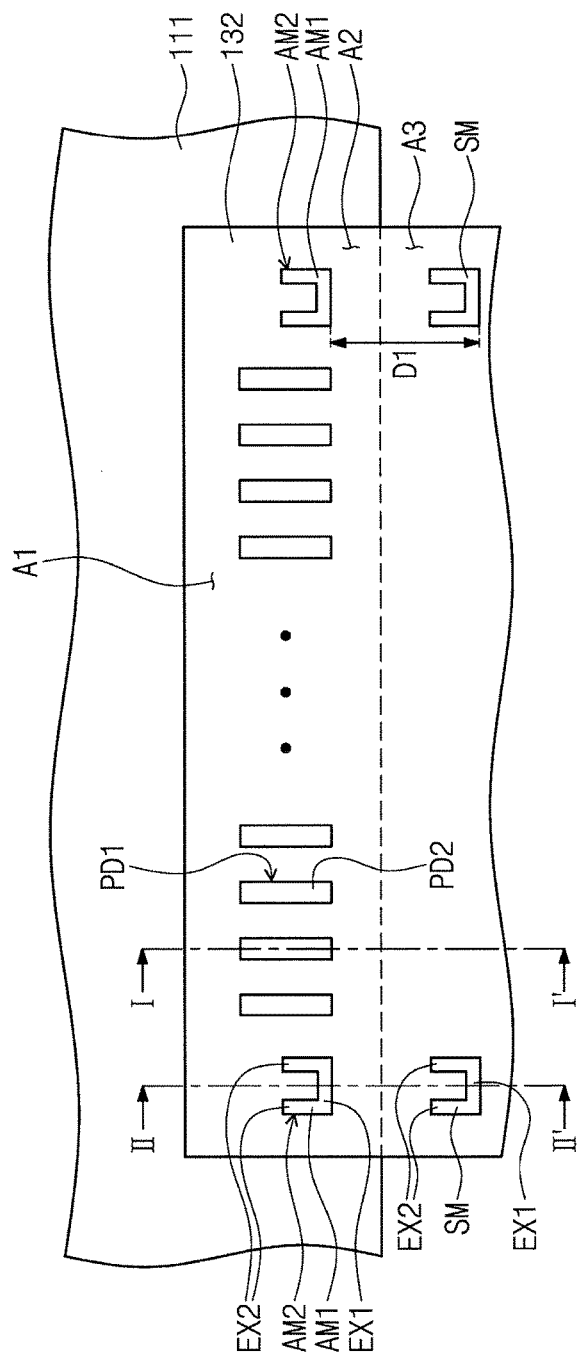
FIG. 4 illustrates a diagram of a state in which the first substrate is attached to the flexible printed circuit board of FIG. 3.

FIG. 3 is a diagram illustrating a state in which a first substrate is separated from one of the flexible printed circuit boards of FIG. 1. FIG. 4 is a diagram illustrating a state in which the first substrate is attached to the flexible printed circuit board of FIG. 3.

FIGS. 3 and 4 illustrate one of the flexible printed circuit boards 132, but others of the flexible printed circuit boards 132 may be attached to the first substrate 111 in the same manner.

For convenience in description, FIGS. 3 and 4 illustrate a portion of the first substrate 111, to which the flexible printed circuit board 132 is attached, and a portion of the flexible printed circuit board 132, to which the first substrate 111 is attached.

Referring to FIGS. 3 and 4, the first substrate 111 of the display panel 110 may include a first region A1 to be overlapped with the flexible printed circuit board 132, and the first substrate 111 may include a plurality of first pads PD1 and a plurality of first alignment marks AM1, which are provided on the first region A1. The first pads PD1 and the first alignment marks AM1 may be formed of or include a metal (e.g., copper or aluminum).

Although the first region A1 is solely illustrated, the first substrate 111 may include a plurality of first regions A1 that are overlapped with the flexible printed circuit boards 132. The first regions A1 of the first substrate 111 may be adjacent to a side of the first substrate 111 in the second direction DR2 and may be arranged in the first direction DR1.

The first pads PD1 and the first alignment marks AM1 may be arranged in the first direction DR1, and here, the first pads PD1 may be interposed between the first alignment marks AM1 in the first direction DR1. For example, a pair of the first alignment marks AM1 may be provided on the first region A1, and the first pads PD1 may be interposed between the pair of the first alignment marks AM1 in the first direction DR1. In another implementation, for example, the number of the first alignment marks AM1 may be greater than two.

The flexible printed circuit board 132 may include a plurality of second pads PD2, which are arranged in the first direction DR1, a plurality of second alignment marks AM2, which are arranged in the first direction DR1 and are spaced apart from each other with the second pads PD2 interposed therebetween, and a plurality of supplementary alignment marks SM, which are disposed to be spaced apart from the second alignment marks AM2 in the second direction DR2. The second pads PD2 and the second alignment marks AM2 may be formed of or include a metal (e.g., copper or aluminum).

The flexible printed circuit board 132 may include a second region A2, which is adjacent to a side of the flexible printed circuit board 132 and is defined as a region of the flexible printed circuit board 132, and a third region A3, which is adjacent to the second region A2. The second region A2 may have substantially the same size as that of the first region A1, and the third region A3 may be defined as a region of the flexible printed circuit board 132, other than the second region A2.

When the flexible printed circuit board 132 is aligned to the first substrate 111, the second region A2 of the flexible printed circuit board 132 may be provided to be overlapped with the first region A1 of the first substrate 111. The second pads PD2 and the second alignment marks AM2 may be provided on the second region A2 of the flexible printed circuit board 132, and the supplementary alignment marks SM may be provided on the third region A3.

The second alignment marks AM2 may be provided to be more adjacent to a side of the flexible printed circuit board 132 in the second direction DR2, compared with the supplementary alignment marks SM. The supplementary alignment marks SM may be spaced apart from the second alignment marks AM2 in the second direction DR2 by the first distance D1.

The second alignment marks AM2 may be provided to correspond to the first alignment marks AM1 in a one-to-one manner, and the supplementary alignment marks SM may be provided to correspond to the second alignment marks AM2 in a one-to-one manner. Thus, the number of the first alignment marks AM1, the number of the second alignment marks AM2, and the number of the supplementary alignment marks SM may be the same.

The first alignment marks AM1, the second alignment marks AM2, and the supplementary alignment marks SM may have the same shape. For example, as shown in FIGS. 3 and 4, each of the first alignment marks AM1, the second alignment marks AM2, and the supplementary alignment marks SM may include a first extended portion EX1, which is provided to extend in the first direction DR1, and a pair of second extended portions EX2, which are provided at both end portions of the first extended portion EX1 and extend in the second direction DR2.

As an example, in FIGS. 3 and 4, the flexible printed circuit board 132 may include a pair of the second alignment marks AM2 and a pair of the supplementary alignment marks SM, but the inventive concept is not limited thereto. For example, the number of the second alignment marks AM2 and the number of the supplementary alignment marks SM may be greater than two.

The first alignment marks AM1 of the first substrate 111 may be provided to be overlapped with the second alignment marks AM2 of the flexible printed circuit board 132, and the flexible printed circuit board 132 may be aligned to the first substrate 111. As a result, the first region A1 of the first substrate 111 may be provided to be overlapped with the second region A2 of the flexible printed circuit board 132. With the flexible printed circuit board 132 is aligned to the first substrate 111, the first pads PD1 of the first substrate 111 and the second pads PD2 of the flexible printed circuit board 132 may be overlapped to each other and may be electrically connected to each other.

An anisotropic conductive film (ACF) may be provided between the first region A1 of the first substrate 111 and the second region A2 of the flexible printed circuit board 132. The second region A2 of the flexible printed circuit board 132 may be attached to the first region A1 of the first substrate 111 by the anisotropic conductive film and may be electrically connected to the first pads PD1 and the second pads PD2 by the anisotropic conductive film. This is described in more detail with reference to FIGS. 5 and 6.

The supplementary alignment marks SM of the flexible printed circuit board 132 may be used to more precisely align the flexible printed circuit board 132 to the first substrate 111. For example, the flexible printed circuit board 132 may be provided in such a way that the supplementary alignment marks SM are overlapped with the first alignment marks AM1 provided on the first region A1 of the first substrate 111.

Next, the supplementary alignment marks SM may be moved by a first distance D1 in the second direction DR2, and the second alignment marks AM2 may be disposed to be overlapped with the first alignment marks AM1. Thereafter, the flexible printed circuit board 132 may be attached to the first substrate 111 by the anisotropic conductive film. This method will be described in more detail with reference to FIGS. 7 to 11.

Figure 5:
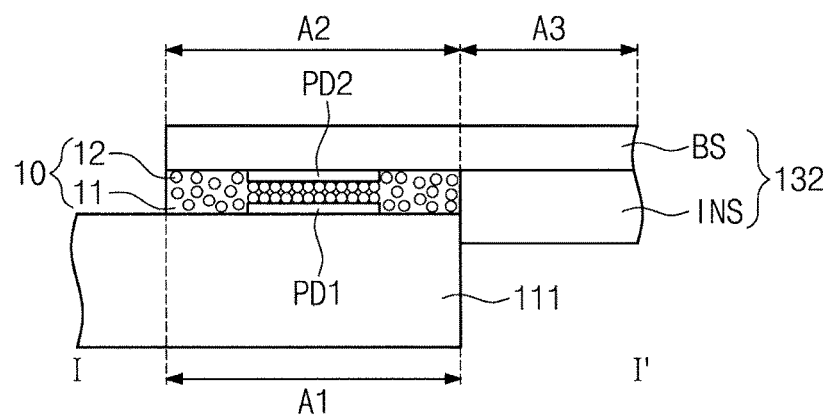
FIG. 5 illustrates a sectional view taken along line I-I' of FIG. 4.
Figure 6:
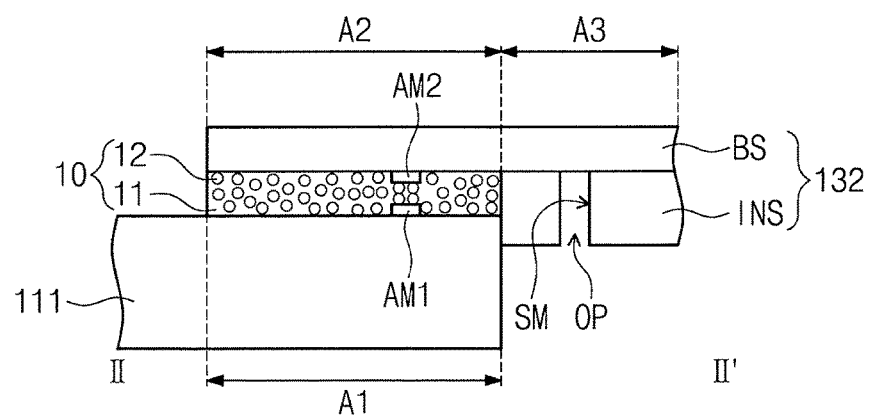
FIG. 6 illustrates a sectional view taken along line II-II' of FIG. 4.

FIG. 5 is a sectional view taken along line I-I' of FIG. 4.
FIG. 6 is a sectional view taken along line II-IP of FIG. 4.

Referring to FIGS. 5 and 6, the flexible printed circuit board 132 may further include a base substrate BS and an insulating layer INS provided below the base substrate BS. Similar to the flexible printed circuit board 132, the base substrate BS may include the second region A2 and the third region A3 adjacent to the second region A2.

The second pads PD2 and the second alignment marks AM2 may be provided on the second region A2 and below the base substrate BS, and the insulating layer INS may be provided on the third region A3 and below the base substrate BS. The insulating layer INS may be spaced apart from the second pads PD2 and the second alignment marks AM2 in the second direction DR2 and may be provided below the base substrate BS.

An anisotropic conductive film 10 may be provided between the first region A1 of the first substrate 111 and the second region A2 of the flexible printed circuit board 132. The anisotropic conductive film 10 may include adhesives 11, which may be cured by heat, and a plurality of conductive particles 12, which may be scattered in the adhesives 11.

The flexible printed circuit board 132 may be aligned to the first substrate 111, and the flexible printed circuit board 132 may be attached to the first substrate 111 by the anisotropic conductive film 10. The anisotropic conductive film 10 may be thermally treated under a specific pressure, when the flexible printed circuit board 132 is attached to the first substrate 111. As a result, the first pads PD1 and the second pads PD2 may be electrically connected to each other through the conductive particles 12, which are included in the anisotropic conductive film 10 and are in contact with each other.

The first pads PD1 may be connected to the data lines DL1-DLn which are provided on the first substrate 111, and the second pads PD2 may be connected to wires connected to the source driver chips 131. The first pads PD1 and the second pads PD2 may be electrically connected to each other, and the source driver chips 131 may be electrically connected to the data lines DL1-DLn. The first and second alignment marks AM1 and AM2 may be used to align the first substrate 111 to the flexible printed circuit board 132 and may not be connected to the wires.

The insulating layer INS may be thicker than the anisotropic conductive film 10 and may be provided on the third region A3. The insulating layer INS may be provided to be in contact with a surface of the anisotropic conductive film 10 and a surface of the first substrate 111. The insulating layer INS may be used to shield the first and second pads PD1 and PD2 from external humidity. The insulating layer INS may include an organic insulating layer, and a cover lay or a solder resist may be used as the insulating layer INS.

Each of the supplementary alignment marks SM may be defined in the form of an opening OP. In some embodiments, the opening OP may be formed by etching a portion of the insulating layer INS. In an implementation, the use of copper or aluminum to form the supplementary alignment marks SM may be avoided, and the openings OP formed in the insulating layer INS may be used as the supplementary alignment marks SM.

FIGS. 7 to 11 are diagrams illustrating a method of manufacturing a display apparatus, according to an example embodiment.

Figure 7:
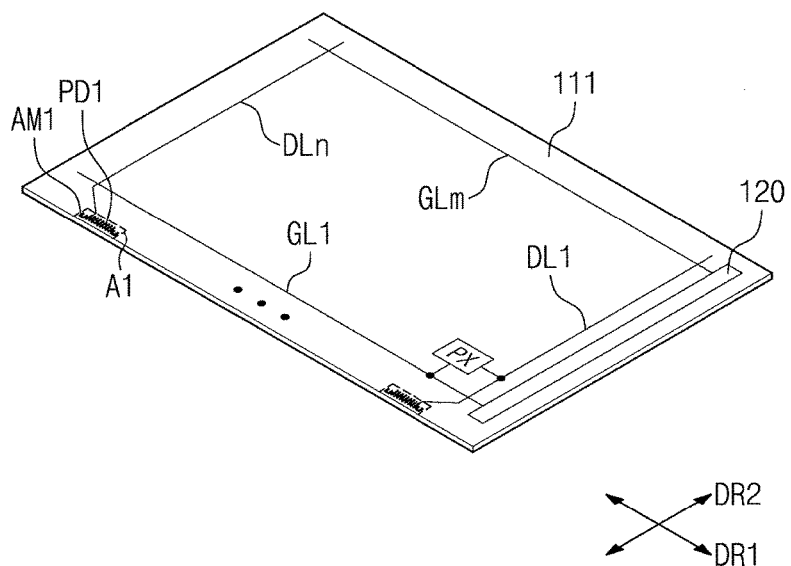
FIGS. 7 to 11 illustrate diagrams of a method of manufacturing a display apparatus, according to an example embodiment.

Referring to FIG. 7, the first substrate 111 may be prepared. The gate lines GL1-GLm, the data lines DL1-DLn, and the pixels PX, which are connected to the gate lines GL1-GLm and the data lines DL1-DLn, may be provided on the first substrate 111. The first pads PD1 and the first alignment marks AM1 may be provided in each of the first regions A1, which formed to be adjacent to a side of the first substrate 111 in the second direction DR2. The data lines DL1-DLn may be connected to the first pads PD1 of the first regions A1.

Figure 8:
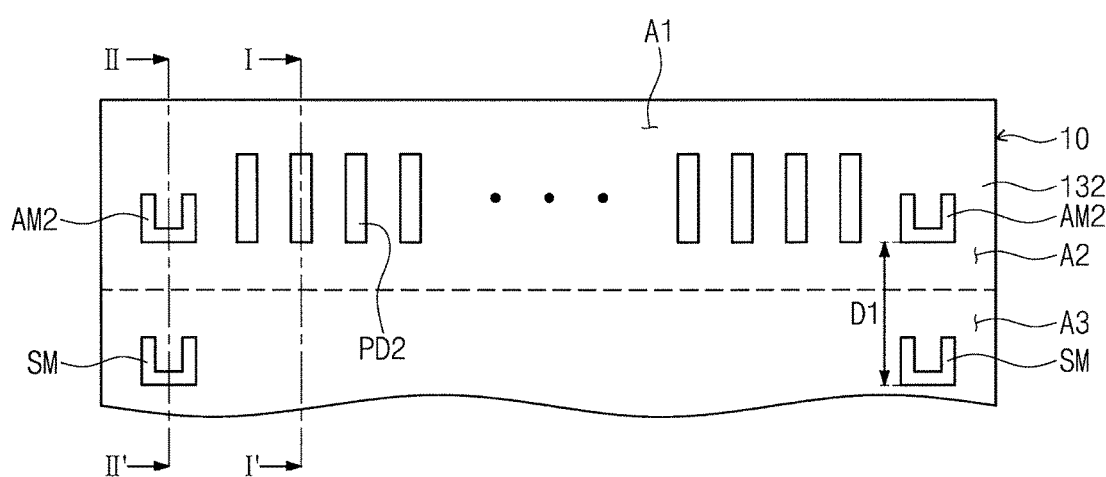

Referring to FIG. 8, the flexible printed circuit board 132 with the second pads PD2, the second alignment marks AM2, and the supplementary alignment marks SM may be prepared. The anisotropic conductive film 10 may be provided below and attached to a bottom surface of the flexible printed circuit board 132. The anisotropic conductive film 10 may be provided on the second region A2 of the flexible printed circuit board 132.

Although, for convenience in description, one flexible printed circuit board 132 is illustrated in FIG. 8, a plurality of anisotropic conductive films 10 may be attached to bottom surfaces of the flexible printed circuit boards 132.

Figure 9:
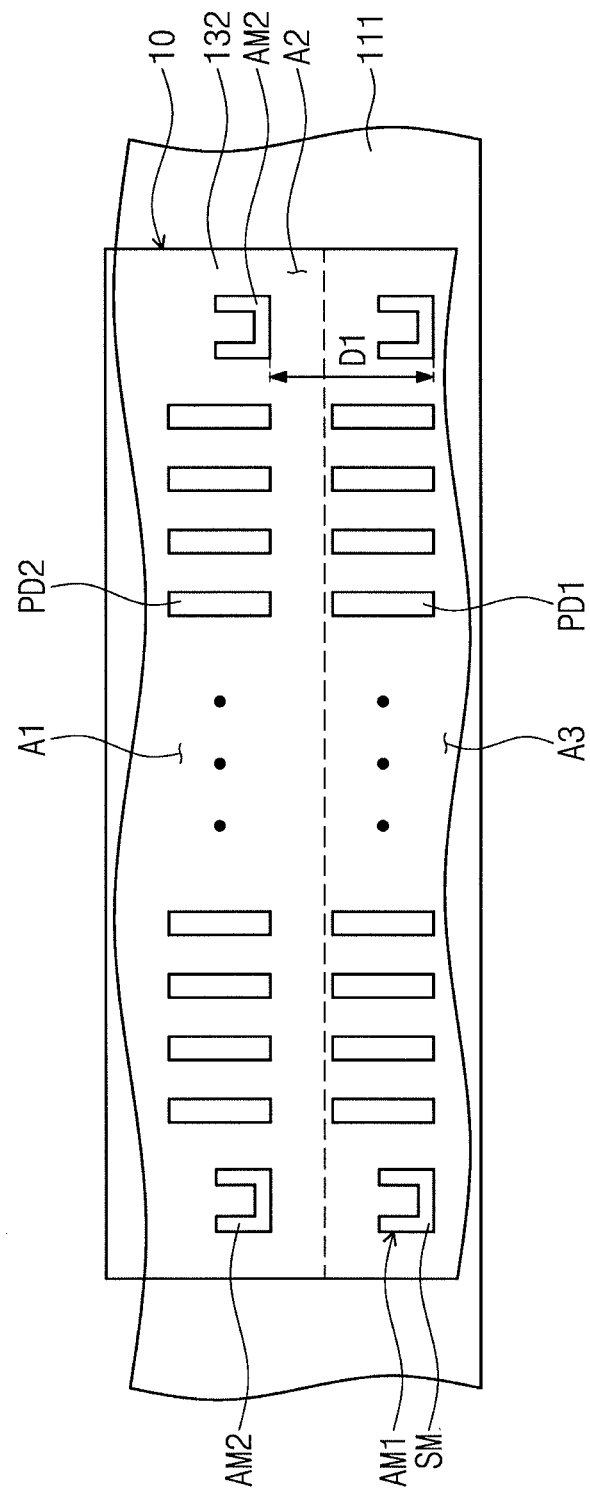

Referring to FIG. 9, the supplementary alignment marks SM of the flexible printed circuit board 132 may be provided to be overlapped with the first alignment marks AM1, which are provided on the first region A1 of the first substrate 111.

Figure 10:
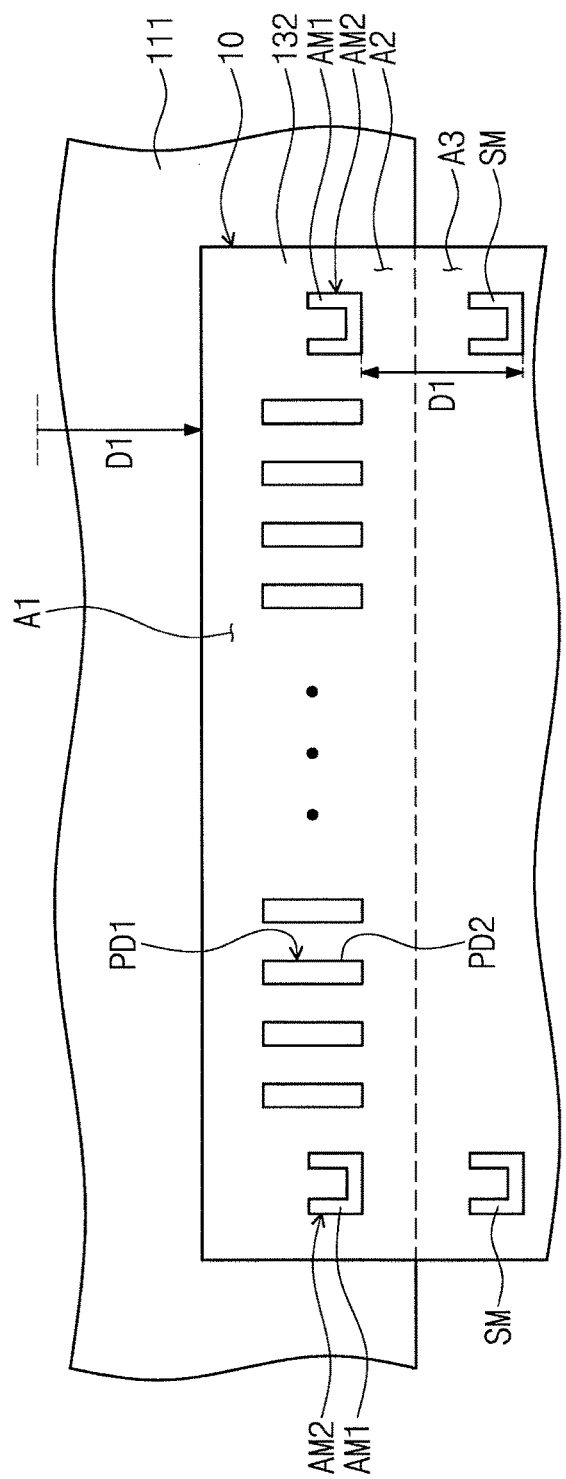

Referring to FIG. 10, the supplementary alignment marks SM of the flexible printed circuit board 132 may be moved by the first distance D1 in the second direction DR2. The supplementary alignment marks SM may be spaced apart from the second alignment marks AM2 in the second direction DR2 by the first distance D1. In the case where the supplementary alignment marks SM is moved by the first distance D1 in the second direction DR2, the first substrate 111 and the flexible printed circuit board 132 may be provided in such a way that the first alignment marks AM1 and the second alignment marks AM2 are overlapped with each other.

To align the flexible printed circuit board 132 to the first region A1 of the first substrate 111, a manufacturer may align the flexible printed circuit board 132 to the first area A1 of the first substrate 111 while looking toward the top of the first substrate 111 from the bottom of the first substrate 111. The first substrate 111 may be transparent, and the first alignment marks AM1 of the first substrate 111 may be clearly recognized when the first substrate 111 is seen from a position below the first substrate 111 in an upward direction.

In the case where the supplementary alignment marks SM are not used, the first alignment marks AM1 may be overlapped with the second alignment marks AM2 and this step may be used to align the flexible printed circuit board 132 to the first region A1. However, owing to the anisotropic conductive film 10 interposed between the first substrate 111 and the flexible printed circuit board 132, there may be a difficulty in clearly recognizing the second alignment marks AM2 of the flexible printed circuit board 132. In this case, the first alignment marks AM1 may not be precisely overlapped with the second alignment marks AM2, and thus, the flexible printed circuit board 132 may not be precisely aligned to the first substrate 111.

In some embodiments, the anisotropic conductive film 10 may not be provided on the third region A3 of the flexible printed circuit board 132, on which the supplementary alignment marks SM are provided. Accordingly, when the first substrate 111 is seen from a position below the first substrate 111 in the upward direction, the supplementary alignment marks SM may be clearly recognized by the manufacturer.

The supplementary alignment marks SM may be overlapped with the first alignment marks AM1, and then, the flexible printed circuit board 132 may be moved by the first distance D1 in the second direction DR2. As a result, the first alignment marks AM1 may be overlapped with the second alignment marks AM2. Accordingly, the first substrate 111 and the flexible printed circuit board 132 may be more precisely aligned to each other.

Figure 11:
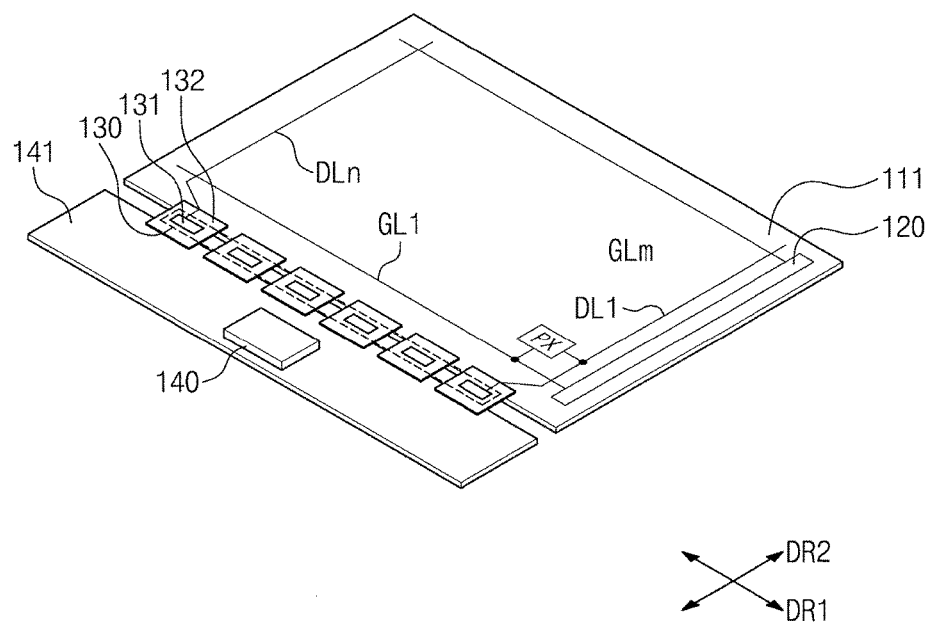

Referring to FIG. 11, using the afore-described alignment method, the flexible printed circuit boards 132 may be disposed in such a way that the second regions A2 are overlapped with the first regions A1 of the first substrate 111, and thus, the flexible printed circuit boards 132 may be precisely aligned to the first substrate 111.

The flexible printed circuit boards 132 may be disposed in such a way that the second regions A2 are overlapped with the first regions A1 of the first substrate 111, and then, the anisotropic conductive films 10 may be pressed to attach the flexible printed circuit boards 132 to the first regions A1 of the first substrate 111. The first pads PD1 of the first substrate 111 and the second pads PD2 of the flexible printed circuit boards 132 may be electrically connected to each other by the anisotropic conductive films 10. Thereafter, the driving circuit board 141 may be connected to the flexible printed circuit boards 132.

The second substrate 112 may be provided to face the first substrate 111 and the liquid crystal layer LC may be provided between the first substrate 111 and the second substrate 112, as shown in FIG. 1, and as a result, the display apparatus 100 may be manufactured.

According to an example embodiment, the first substrate 111 may be disposed in such a way that the first alignment marks AM1 are overlapped with the supplementary alignment marks SM of the flexible printed circuit boards 132, and then, the flexible printed circuit boards 132 may be moved by the first distance D1 in the second direction DR2 to overlap the first alignment marks AM1 to the second alignment marks AM2. As a result, the flexible printed circuit boards 132 may be precisely aligned to and attached to the display panel 110.

Figure 12:
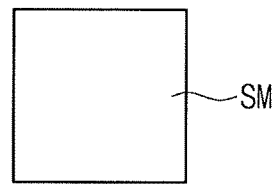
FIGS. 12 to 14 illustrate diagrams of various shapes of supplementary alignment marks, according to an example embodiment.
Figure 13:
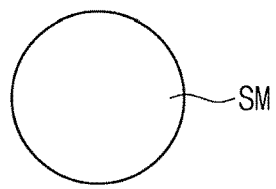
Figure 14:
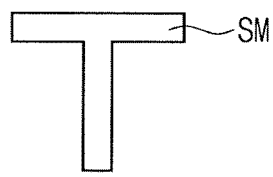

FIGS. 12 to 14 are diagram illustrating various shapes of supplementary alignment marks, according to an example embodiment.

Referring to FIGS. 12 to 14, the supplementary alignment marks SM may have a rectangular shape, a circular shape, or a letter 'T'-like shape, unlike the supplementary alignment marks SM shown in FIG. 3. The first and second alignment marks AM1 and AM2 may also have a rectangular shape, a circular shape, or a letter 'T'-like shape, similar to the supplementary alignment marks SM.

By way of summation and review, a data driving part may include a plurality of source driver chips and a plurality of flexible printed circuit boards, on which the source driver chips are mounted. The flexible printed circuit boards may be attached and connected to a side of a substrate with the pixels, and the source driver chips may be connected to the pixels via the flexible printed circuit boards.

A plurality of pad electrodes may be provided on the flexible printed circuit boards. The pad electrodes may be provided on the substrate and may be configured to receive the data voltages to be applied to the pixels. With the flexible printed circuit boards attached to the substrate, the pad electrodes of the flexible printed circuit boards are electrically connected to the pad electrodes of the substrate.

As described above, embodiments relate to a display apparatus, which is configured to allow for more precise attachment of flexible printed circuit boards to a display panel, and a method of manufacturing the same.

In a display apparatus according to an example embodiment, flexible printed circuit boards may be disposed to overlap supplementary alignment marks with first alignment marks of a display panel, and the flexible printed circuit boards may be moved by a distance between second alignment marks of the flexible printed circuit boards and the supplementary alignment marks. As a result, the flexible printed circuit boards may be more precisely aligned to and attached to the display panel.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
a display panel including first regions arranged in a first direction and a plurality of first alignment marks which are respectively provided on the first regions and are arranged in the first direction; and
a plurality of flexible printed circuit boards connected to the display panel, each of the flexible printed circuit boards including:
a plurality of second alignment marks arranged in the first direction and overlapped with the first alignment marks;
an insulating layer spaced apart from the second alignment marks in a second direction crossing the first direction; and
a plurality of supplementary alignment marks spaced apart from the second alignment marks by a first distance in the second direction, the supplementary alignment marks being openings defined in the insulating layer.

2. The display apparatus as claimed in claim 1, wherein:
the display panel further includes first and second substrates facing each other and a liquid crystal layer between the first and second substrates,
the first regions are defined in the first substrate,
the first alignment marks are provided on the first regions of the first substrate, and
the first regions are disposed to be adjacent to a side of the first substrate in the second direction.

3. The display apparatus as claimed in claim 2, wherein:
the first substrate further includes:
a plurality of pixels connected to a plurality of gate lines and a plurality of data lines; and
a plurality of first pads arranged in the first direction and provided on the first regions, respectively, and
wherein:
the data lines are connected to the first pads, and
the first alignment marks are spaced apart from each other with the first pads interposed therebetween.

4. The display apparatus as claimed in claim 3, wherein:
each of the flexible printed circuit boards further includes a second region, which is adjacent to a side thereof in the second direction, and a plurality of second pads, which are provided on the second region,
the second region of each of the flexible printed circuit boards is overlapped with a corresponding a first region of the first regions,
the insulating layer of each of the flexible printed circuit boards is provided on a third region of each of the flexible printed circuit boards, which is adjacent to the second region of each of the flexible printed circuit boards, and
the first alignment marks of each of the flexible printed circuit boards are spaced apart from each other in the first direction with the second pads of each of the flexible printed circuit boards interposed therebetween.

5. The display apparatus as claimed in claim 4, further comprising a plurality of anisotropic conductive films provided between the first regions of the first substrate and the second regions of the flexible printed circuit boards.

6. The display apparatus as claimed in claim 5, wherein the first pads on the first regions and the second pads on the second regions are electrically connected to each other through the anisotropic conductive films.

7. The display apparatus as claimed in claim 5, wherein the insulating layer of each of the flexible printed circuit boards is thicker than each of the anisotropic conductive films.

8. The display apparatus as claimed in claim 1, wherein the first and second alignment marks and the supplementary alignment marks have the same shape.

9. The display apparatus as claimed in claim 8, wherein each of the first and second alignment marks and the supplementary alignment marks includes a first extended portion extending in the first direction and a plurality of second extended portions extending from both end portions of the first extended portion in the second direction.

10. The display apparatus as claimed in claim 8, wherein each of the first and second alignment marks and the supplementary alignment marks has a rectangular, circular, or a letter 'T'-like shape.

11. The display apparatus as claimed in claim 1, wherein the insulating layer of each of the flexible printed circuit boards includes an organic insulating layer.

12. A method of manufacturing a display apparatus, the method comprising:
preparing a first substrate, in which first regions arranged in a first direction are defined, the first substrate including a plurality of first alignment marks provided on the first regions, respectively;
preparing a plurality of flexible printed circuit boards, each of which includes a plurality of second alignment marks arranged in the first direction, an insulating layer spaced apart from the second alignment marks in a second direction crossing the first direction, and a plurality of supplementary alignment marks spaced apart from the second alignment marks by a first distance in the second direction, the supplementary alignment marks being formed by etching the insulating layer;
overlapping the supplementary alignment marks to the first alignment marks;
moving the flexible printed circuit boards by the first distance in the second direction to overlap the second alignment marks to the first alignment marks;
attaching the flexible printed circuit boards to the first regions of the first substrate; and
disposing a second substrate to face the first substrate and disposing a liquid crystal layer between the first and second substrates.

13. The method as claimed in claim 12, wherein:
the first substrate further includes:
a plurality of pixels connected to a plurality of gate lines and a plurality of data lines; and
a plurality of first pads arranged in the first direction and provided on the first regions, respectively, and
wherein:
the first regions are adjacent to a side of the first substrate in the second direction,
the data lines are connected to the first pads on the first regions, and
the first alignment marks on each of the first regions are spaced apart from each other with the first pads, which are provided on each of the first regions and are interposed between the first alignment marks.

14. The method as claimed in claim 13, wherein:
each of the flexible printed circuit boards further includes a second region, which is adjacent to a side thereof in the second direction, and a plurality of second pads, which are provided on the second region,
the second region of each of the flexible printed circuit boards is overlapped with a corresponding one of the first regions,
the insulating layer of each of the flexible printed circuit boards is provided on a third region of each of the flexible printed circuit boards, which is adjacent to the second region of each of the flexible printed circuit boards, and
the first alignment marks of each of the flexible printed circuit boards are spaced apart from each other in the first direction with the second pads of each of the flexible printed circuit boards interposed therebetween.

15. The method as claimed in claim 14, wherein:
the preparing of the flexible printed circuit boards further includes disposing a plurality of anisotropic conductive films on the second regions of the flexible printed circuit boards, and
the flexible printed circuit boards are attached to the first regions of the first substrate by the anisotropic conductive films.

16. The method as claimed in claim 15, wherein the first pads on the first regions and the second pads on the second regions are electrically connected to each other through the anisotropic conductive films.

17. The method as claimed in claim 15, wherein the insulating layer of each of the flexible printed circuit boards is thicker than each of the anisotropic conductive films.

18. The method as claimed in claim 12, wherein the first and second alignment marks and the supplementary alignment marks have the same shape.

19. The method as claimed in claim 17, wherein each of the first and second alignment marks and the supplementary alignment marks includes a first extended portion extending in the first direction and a plurality of second extended portions extending from both end portions of the first extended portion in the second direction.

20. The method as claimed in claim 12, wherein the insulating layer includes an organic insulating layer.

* * * * *